United States Patent
Tsai et al.

(10) Patent No.: US 11,327,866 B2
(45) Date of Patent: May 10, 2022

(54) MEMORY TEST METHOD

(71) Applicant: ONE TEST SYSTEMS, Santa Clara, CA (US)

(72) Inventors: Chen-Lung Tsai, Saratoga, CA (US); Gene Rosenthal, Santa Cruz, CA (US)

(73) Assignee: ONE TEST SYSTEMS

( * ) Notice: Subject to any disclaimer, the term of this patent is extended or adjusted under 35 U.S.C. 154(b) by 162 days.

(21) Appl. No.: 16/735,705

(22) Filed: Jan. 7, 2020

(65) Prior Publication Data
US 2021/0019245 A1   Jan. 21, 2021

(30) Foreign Application Priority Data

Jul. 17, 2019 (TW) ................................. 108125196

(51) Int. Cl.
*G06F 11/30* (2006.01)
*G06F 11/36* (2006.01)
*G06F 11/07* (2006.01)
*G11C 29/12* (2006.01)
*G11C 29/44* (2006.01)

(52) U.S. Cl.
CPC ........ *G06F 11/3058* (2013.01); *G06F 11/076* (2013.01); *G06F 11/3037* (2013.01); *G06F 11/3688* (2013.01); *G06F 11/3692* (2013.01); *G11C 29/12* (2013.01); *G11C 2029/4402* (2013.01)

(58) Field of Classification Search
CPC ............ G06F 11/3058; G06F 11/3037; G06F 11/3688; G06F 11/076; G06F 11/3692; G11C 29/12; G11C 2029/4402; G11C 2029/5602; G11C 29/56016; G11C 29/06

USPC .......................................................... 714/734
See application file for complete search history.

(56) References Cited

U.S. PATENT DOCUMENTS

| | | | |
|---|---|---|---|
| 6,292,009 B1 * | 9/2001 | Farnworth | G01R 31/2841 324/762.03 |
| 6,574,763 B1 * | 6/2003 | Bertin | G01R 31/287 324/750.05 |
| 6,988,237 B1 * | 1/2006 | Solt | G06F 11/2215 714/763 |

(Continued)

FOREIGN PATENT DOCUMENTS

| | | |
|---|---|---|
| TW | 201222553 A1 | 6/2012 |
| TW | 201317995 A1 | 5/2013 |
| TW | I567400 B | 1/2017 |

*Primary Examiner* — James C Kerveros
(74) *Attorney, Agent, or Firm* — Li & Cai Intellectual Property Office

(57) ABSTRACT

A memory test method for being implemented by storing corresponding test result data and test parameter data into memory chips when a burn-in test, a high temperature test, a low temperature test, and a normal temperature test are performed on the memory chips. A memory test method for being implemented by storing the corresponding test result data and the test parameter data into the memory chips after the memory chips finish the burn-in test, the high temperature test, the low temperature test, and the normal temperature test. The memory chips can internally store the test result data and the test parameter data after finishing tests through the memory test method of the present disclosure so that relevant personnel can read data to easily trace back test history of the memory chips.

9 Claims, 14 Drawing Sheets

(56) References Cited

U.S. PATENT DOCUMENTS

| | | | | |
|---|---|---|---|---|
| 2005/0116222 A1* | 6/2005 | Chou | ............... | G11C 29/006 257/48 |
| 2009/0295420 A1* | 12/2009 | Shiba | ............ | G01R 31/3025 324/750.3 |
| 2010/0271064 A1* | 10/2010 | Kohler | ........... | G11C 29/4401 324/750.05 |
| 2021/0020260 A1* | 1/2021 | Tsai | ............... | G01R 31/2875 |
| 2021/0132142 A1* | 5/2021 | Tsai | ..................... | G11C 7/04 |

* cited by examiner

```
┌─────────────────────────────────────────────────────────────┐
│ a burn-in test step implemented by providing a plurality of memory │
│ chips in an environment having a first predetermined temperature, │
│         and testing each of the memory chips                │──S11
│       with at least one of a reading test, a writing test,  │
│                 and an electrical property test             │
└─────────────────────────────────────────────────────────────┘
                              │
                              ▼
┌─────────────────────────────────────────────────────────────┐
│ a burn-in step test result writing step implemented by storing test │
│ result data of each of the memory chips finishing the burn-in test │
│ step, and test parameter data corresponding to the burn-in test step │──S12
│                 into each of the memory chips               │
└─────────────────────────────────────────────────────────────┘
                              │
                              ▼
┌─────────────────────────────────────────────────────────────┐
│     a high temperature test step implemented by providing the │
│  memory chips in an environment having a second predetermined │
│   temperature, and testing each of the memory chips with at least │──S13
│  one of a read ID test, a writing test, and an electrical property test │
└─────────────────────────────────────────────────────────────┘
                              │
                              ▼
┌─────────────────────────────────────────────────────────────┐
│  a high temperature test result writing step implemented by storing │
│   the test result data of each of the memory chips finishing the high │
│  temperature test step, and the test parameter data corresponding to │──S14
│     the high temperature test step into each of the memory chips │
└─────────────────────────────────────────────────────────────┘
```

FIG. 1

```
┌─────────────────────────────────────────────────────────────┐
│ a burn-in test step implemented by providing a plurality of memory │
│ chips in an environment having a first predetermined temperature, │
│       and testing each of the memory chips                  │──S11
│    with at least one of a reading test, a writing test,    │
│            and an electrical property test                  │
└─────────────────────────────────────────────────────────────┘
                              │
                              ▼
┌─────────────────────────────────────────────────────────────┐
│ a burn-in step test result writing step implemented by storing test │
│ result data of each of the memory chips finishing the burn-in test │
│ step, and test parameter data corresponding to the burn-in test step │──S12
│              into each of the memory chips                  │
└─────────────────────────────────────────────────────────────┘
                              │
                              ▼
┌─────────────────────────────────────────────────────────────┐
│         a high temperature test step implemented by providing the │
│    memory chips in an environment having a second predetermined │
│    temperature, and testing each of the memory chips with at least │──S13
│     one of a read ID test, a writing test, and an electrical property test │
└─────────────────────────────────────────────────────────────┘
                              │
                              ▼
┌─────────────────────────────────────────────────────────────┐
│ a high temperature test result writing step implemented by storing │
│  the test result data of each of the memory chips finishing the high │
│  temperature test step, and the test parameter data corresponding to │──S14
│      the high temperature test step into each of the memory chips │
└─────────────────────────────────────────────────────────────┘
                              │
                              ▼
┌─────────────────────────────────────────────────────────────┐
│ a low temperature test step implemented by providing the memory │
│ chips in an environment having a third predetermined temperature, │──S15
│ and testing each of the memory chips with at least one of a read ID │
│        test, a writing test, and an electrical property test │
└─────────────────────────────────────────────────────────────┘
                              │
                              ▼
┌─────────────────────────────────────────────────────────────┐
│ a low temperature test result writing step implemented by storing │
│  the test result data of each of the memory chips finishing the low │──S16
│  temperature test step, and the test parameter data corresponding to │
│      the low temperature test step into each of the memory chips │
└─────────────────────────────────────────────────────────────┘
```

FIG. 2 a test and record step implemented by providing a plurality of memory chips in at least one predetermined temperature environment, testing each of the memory chips with at least one of a read ID test, a writing test, and an electrical property test, and recording the corresponding test result data and the test parameter data of each of the memory chips finishing the at least one of a read ID test, a writing test, and an electrical property test in the different predetermined temperature environments ~S31 a test result writing step implemented by storing the test result data and the test parameter data corresponding to each of the memory chips into each of the memory chips so that each of the memory chips stores the corresponding test result data and the test parameter data ~S32

FIG. 5

MEMORY TEST METHOD

CROSS-REFERENCE TO RELATED PATENT APPLICATION

This application claims the benefit of priority to Taiwan Patent Application No. 108125196, filed on Jul. 17, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a test method, and more particularly to a memory test method.

BACKGROUND OF THE DISCLOSURE

Generally, memory chips are performed with particular tests in different temperature environments according to practical requirements before leaving factory. When the memory chips are mounted on electrical devices and sold, if failure issues occur on the memory chips under an allowable temperature range of an original design, the failure issues may have occurred during the tests before leaving the factory.

A conventional memory test apparatus do not record related test results and corresponding parameters of memory tests. Therefore, even though relevant personnel receive a memory chip sent back by a user, hardly can the relevant personnel trace back the related parameters and the related test results of the memory chips in testing process.

SUMMARY OF THE DISCLOSURE

In response to the above-referenced technical inadequacies, the present disclosure provides a memory test method to improve issues of a conventional memory test method associated with difficulties in tracing back a testing process of any memory chips after the memory chips finish the tests. Therefore, it is not easy to determine whether failure issues happen in the testing process when the memory chips fail.

In one aspect, the present disclosure provides a memory test method including a burn-in test step, a burn-in test step result writing step, a high temperature test step, and a high temperature test result writing step. The burn-in test step is implemented by providing a plurality of memory chips in an environment having a first predetermined temperature, and testing each of the memory chips with at least one of a reading test, a writing test, and an electrical property test. The burn-in test step result writing step is implemented by storing test result data of each of the memory chips after finishing the burn-in test step and test parameter data corresponding to the burn-in test step into each of the memory chips. The high temperature test step is implemented by providing the memory chips in an environment having a second predetermined temperature, and testing each of the memory chips with at least one of a reading test, a writing test, and an electrical property test. The high temperature test result writing step is implemented by storing the test result data of each of the memory chips after finishing the high temperature test step and the test parameter data corresponding to the high temperature test step into each of the memory chips.

The present disclosure provides a memory test method including a high temperature test step, a high temperature test result writing step, a burn-in test step, a burn-in test step result writing step. The high temperature test step is implemented by providing a plurality of memory chips in an environment having a second predetermined temperature, and testing each of the memory chips with at least one of a reading test, a writing test, and an electrical property test. The high temperature test result writing step is implemented by storing the test result data of each of the memory chips after finishing the high temperature test step and the test parameter data corresponding to the high temperature test step into each of the memory chips. The burn-in test step is implemented by providing the memory chips in an environment having a first predetermined temperature, and testing each of the memory chips with at least one of a reading test, a writing test, and an electrical property test. The burn-in test step result writing step is implemented by storing test result data of each of the memory chips after finishing the burn-in test step and the test parameter data corresponding to the burn-in test step into each of the memory chips. The second predetermined temperature is within a range of 30° C. to 130° C., and the first predetermined temperature is higher than the second predetermined temperature.

The present disclosure provides a memory test method including a test and record step implemented by providing a plurality of memory chips in a predetermined temperature environment, testing each of the memory chips with at least one of a reading test, a writing test, and an electrical property test, and recording corresponding test result data and test parameter data of each of the memory chips after finishing the at least one of a reading test, a writing test, and an electrical property test in the predetermined temperature environment; and a test result writing step implemented by storing the test result data and the test parameter data corresponding to each of the memory chips into each of the memory chips so that each of the memory chips stores the corresponding test result data and the test parameter data.

Therefore, the memory test method of the present disclosure includes the effects as follows. The related test result data and the test parameter data are stored into the memory chips before leaving factory. After the memory chips leave the factory, related personnel can directly read the test result data and the test parameter data stored in the memory chips to quickly trace back related data of the memory chips in the testing process, thereby helping the related personnel to figure out reason of failure of the memory chips.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

FIG. 1 is a flowchart of a memory test method of the present disclosure according to a first embodiment of the present disclosure.

FIG. 2 is a flowchart of the memory test method of the present disclosure according to a second embodiment of the present disclosure.

FIG. 5 is a flowchart of the memory test method of the present disclosure according to a fifth embodiment of the present disclosure.

DETAILED DESCRIPTION OF THE EXEMPLARY EMBODIMENTS

Figure 3:
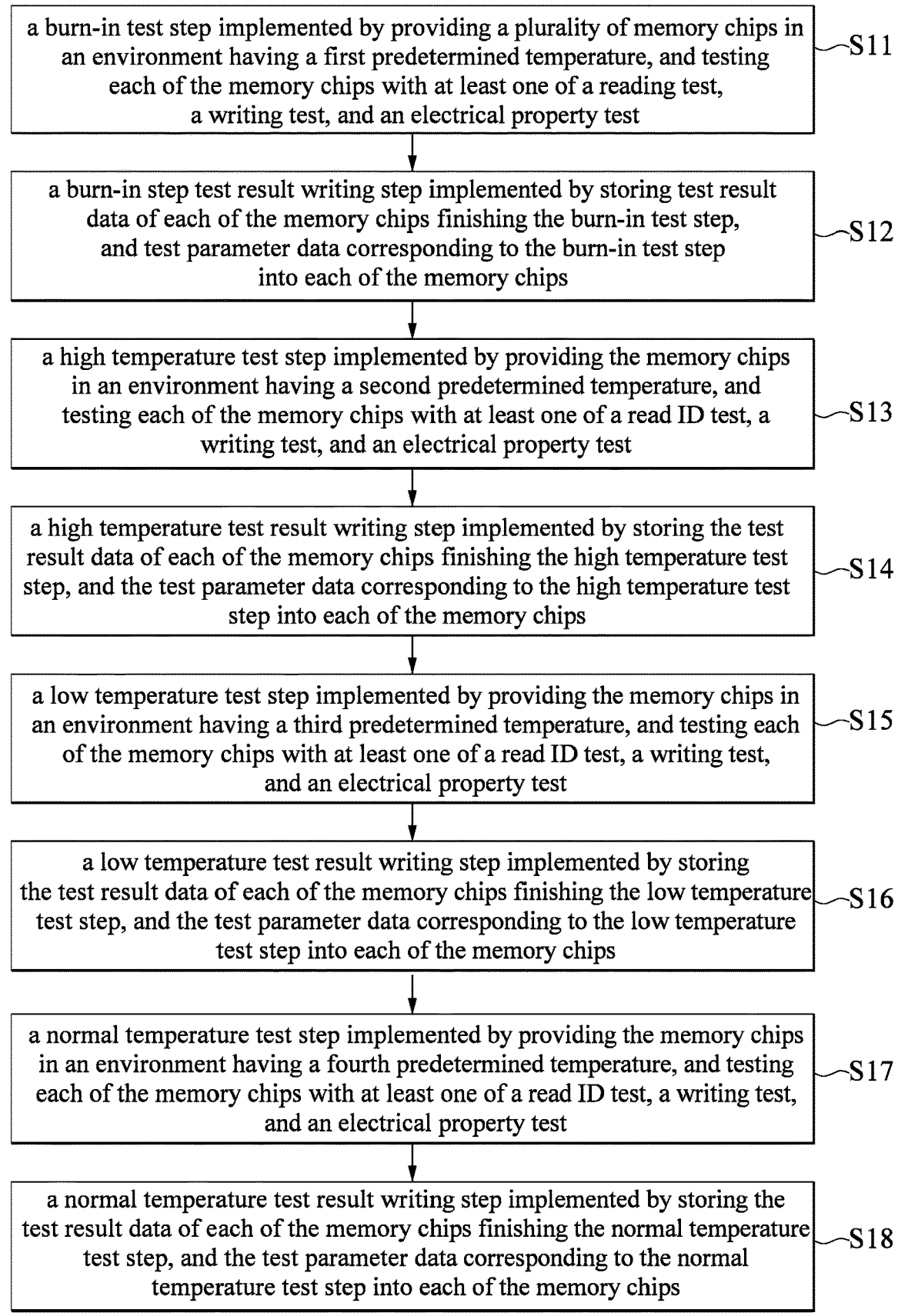
FIG. 3 is a flowchart of the memory test method of the present disclosure according to a third embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1, FIG. 1 is a flowchart of a memory test method of the present disclosure according to a first embodiment of the present disclosure. The memory test method includes a burn-in test step S11, a burn-in test step result writing step S12, a high temperature test step S13, and a high temperature test result writing step S14. Specifically, the above steps S11~S14 are disclosed as follows.

The burn-in test step S11 is implemented by providing a plurality of memory chips in an environment having a first predetermined temperature, and testing each of the memory chips with at least one of a reading test, a writing test, and an electrical property test.

The burn-in test step result writing step S12 is implemented by storing test result data of each of the memory chips after finishing the burn-in test step and test parameter data corresponding to the burn-in test step into each of the memory chips.

The high temperature test step S13 is implemented by providing the memory chips in an environment having a second predetermined temperature, and testing each of the memory chips with at least one of a reading test, a writing test, and an electrical property test.

The high temperature test result writing step S14 is implemented by storing the test result data of each of the memory chips after finishing the high temperature test step and the test parameter data corresponding to the high temperature test step into each of the memory chips.

In a practical application, the first predetermined temperature can be determined according to practical requirements. For example, the first predetermined temperature can be within a range of 30° C. to 200° C. The second predetermined temperature can be determined according to practical requirements. For example, the second predetermined temperature can be within a range of 30° C. to 130° C. The memory test method of the present disclosure is applicable to various memory testing apparatuses, and the present disclosure is not limited thereto. More specifically, in a memory testing process, the memory chips are tested with a reading test, a writing test, and an electrical property test in different temperature environments. Therefore, by changing a related testing program of the memory testing apparatus, related test data and related test parameter of the memory testing apparatus can be stored into the memory chips by a related read-write device. Naturally, a related data collector or a related transmitting apparatus is needed to collect and transmit the related test parameter to the read-write device so that the read-write device can receive related data configured to be stored into the memory chips.

Referring to FIG. 2, FIG. 2 is a flowchart of the memory test method of the present disclosure according to a second embodiment of the present disclosure. The memory test method includes a burn-in test step S11, a burn-in test step result writing step S12, a high temperature test step S13, a high temperature test result writing step S14, a low temperature test step S15, and a low temperature test result writing step S16. Specifically, the above steps S11~S16 are disclosed as follows.

The burn-in test step S11 is implemented by providing a plurality of memory chips in an environment having a first predetermined temperature, and testing each of the memory chips with at least one of a reading test, a writing test, and an electrical property test.

The burn-in test step result writing step S12 is implemented by storing the test result data of each of the memory chips after finishing the burn-in test step, and the test parameter data corresponding to the burn-in test step into each of the memory chips.

The high temperature test step S13 is implemented by providing the memory chips in an environment having a second predetermined temperature, and testing each of the memory chips with at least one of a reading test, a writing test, and an electrical property test.

The high temperature test result writing step S14 is implemented by storing the test result data of each of the memory chips after finishing the high temperature test step, and the test parameter data corresponding to the high temperature test step into each of the memory chips.

The low temperature test step S15 is implemented by providing the memory chips in an environment having a third predetermined temperature, and testing each of the memory chips with at least one of a reading test, a writing test, and an electrical property test.

The low temperature test result writing step S16 is implemented by storing the test result data of each of the memory chips after finishing the low temperature test step and the test parameter data corresponding to the low temperature test step into each of the memory chips.

The first predetermined temperature can be within a range of 30° C. to 200° C. The second predetermined temperature can be within a range of 30° C. to 130° C. The third predetermined temperature can be determined according to practical requirements. For example, the third predetermined temperature can be within a range of −55° C. to 30° C.

In other embodiments of the present disclosure, the sequence of the steps S11~S16 can be changed as below: the low temperature test step S15, the low temperature test result writing step S16, the burn-in test step S11, the burn-in test step result writing step S12, the high temperature test step S13, and the high temperature test result writing step S14.

In other embodiments of the present disclosure, the sequence of the steps S11~S16 can be changed as below: the high temperature test step S13, the high temperature test result writing step S14, the burn-in test step S11, the burn-in test step result writing step S12, the low temperature test step S15, and the low temperature test result writing step S16.

In other embodiments of the present disclosure, the sequence of the steps S11~S16 can be changed as below: the low temperature test step S15, the low temperature test result writing step S16, the high temperature test step S13, the high temperature test result writing step S14, the burn-in test step S11, and the burn-in test step result writing step S12.

Referring to FIG. 3, FIG. 3 is a flowchart of the memory test method of the present disclosure according to a third embodiment of the present disclosure. The memory test method includes a burn-in test step S11, a burn-in test step result writing step S12, a high temperature test step S13, a high temperature test result writing step S14, a low temperature test step S15, a low temperature test result writing step S16, a normal temperature test step S17, and a normal temperature test result writing step S18. Specifically, the above steps S11~S18 are disclosed as follows.

The burn-in test step S11 is implemented by providing a plurality of memory chips in an environment having a first predetermined temperature, and testing each of the memory chips with at least one of a reading test, a writing test, and an electrical property test.

The burn-in test step result writing step S12 is implemented by storing the test result data of each of the memory chips after finishing the burn-in test step and the test parameter data corresponding to the burn-in test step into each of the memory chips.

The high temperature test step S13 is implemented by providing the memory chips in an environment having a second predetermined temperature, and testing each of the memory chips with at least one of a reading test, a writing test, and an electrical property test.

The high temperature test result writing step S14 is implemented by storing the test result data of each of the memory chips after finishing the high temperature test step and the test parameter data corresponding to the high temperature test step into each of the memory chips.

The low temperature test step S15 is implemented by providing the memory chips in an environment having a third predetermined temperature, and testing each of the memory chips with at least one of a reading test, a writing test, and an electrical property test.

The low temperature test result writing step S16 is implemented by storing the test result data of each of the memory chips after finishing the low temperature test step and the test parameter data corresponding to the low temperature test step into each of the memory chips.

The normal temperature test step S17 is implemented by providing the memory chips in an environment having a fourth predetermined temperature, and testing each of the memory chips with at least one of a reading test, a writing test, and an electrical property test.

The normal temperature test result writing step S18 is implemented by storing the test result data of each of the memory chips after finishing the normal temperature test step and the test parameter data corresponding to the normal temperature test step into each of the memory chips.

The first predetermined temperature can be within a range of 30° C. to 200° C. The second predetermined temperature can be within a range of 30° C. to 130° C. The third predetermined temperature can be within a range of −55° C. to 30° C. The fourth predetermined temperature can be determined according to practical requirements. For example, the fourth predetermined temperature can be an ambient temperature that is within a range of 20° C. to 30° C. The low temperature test step S15 and the low temperature test result writing step S16 can be viewed as a low temperature test and writing step. The normal temperature test step S17 and normal temperature test result writing step can be viewed as a normal temperature test and writing step. At least one of the low temperature test and writing step and the normal temperature test and writing step can be arranged before the burn-in test step S11 or after the high temperature test result writing step S14 according to practical requirements.

In other embodiments of the present disclosure, the sequence of the steps S11~S18 can be changed as below: the burn-in test step S11, the burn-in test step result writing step S12, the high temperature test step S13, the high temperature test result writing step S14, the normal temperature test step S17, the normal test result writing step S18, the low temperature test step S15, and the low temperature test result writing step S16.

In other embodiments of the present disclosure, the sequence of the steps S11~S18 can be changed as below: the low temperature test step S15, the low temperature test result writing step S16, the normal temperature test step S17, the normal test result writing step S18, the burn-in test step S11, the burn-in test step result writing step S12, the high temperature test step S13, and the high temperature test result writing step S14.

In other embodiments of the present disclosure, the sequence of the steps S11~S18 can be changed as below: the normal temperature test step S17, the normal test result writing step S18, the low temperature test step S15, the low temperature test result writing step S16, the burn-in test step S11, the burn-in test step result writing step S12, the high temperature test step S13, and the high temperature test result writing step S14.

In other embodiments of the present disclosure, the sequence of the steps S11~S18 can be changed as below: the low temperature test step S15, the low temperature test result writing step S16, the burn-in test step S11, the burn-in test step result writing step S12, the high temperature test step S13, the high temperature test result writing step S14, the normal temperature test step S17, and the normal test result writing step S18.

In other embodiments of the present disclosure, the sequence of the steps S11~S18 can be changed as below: the normal temperature test step S17, the normal test result writing step S18, the burn-in test step S11, the burn-in test step result writing step S12, the high temperature test step S13, the high temperature test result writing step S14, the low temperature test step S15, and the low temperature test result writing step S16

It is worth mentioning that, in other embodiments of the present disclosure, the memory test method is not limited to include the low temperature test step S15 and the low temperature test result writing step S16. The memory test method can include the normal temperature test step S17, the normal test result writing step S18, the burn-in test step S11, the burn-in test step result writing step S12, the high temperature test step S13, and the high temperature test result writing step S14. Or, the memory test method can include the burn-in test step S11, the burn-in test step result writing step S12, the high temperature test step S13, the high temperature test result writing step S14, the normal temperature test step S17, and the normal test result writing step S18.

Figure 4:
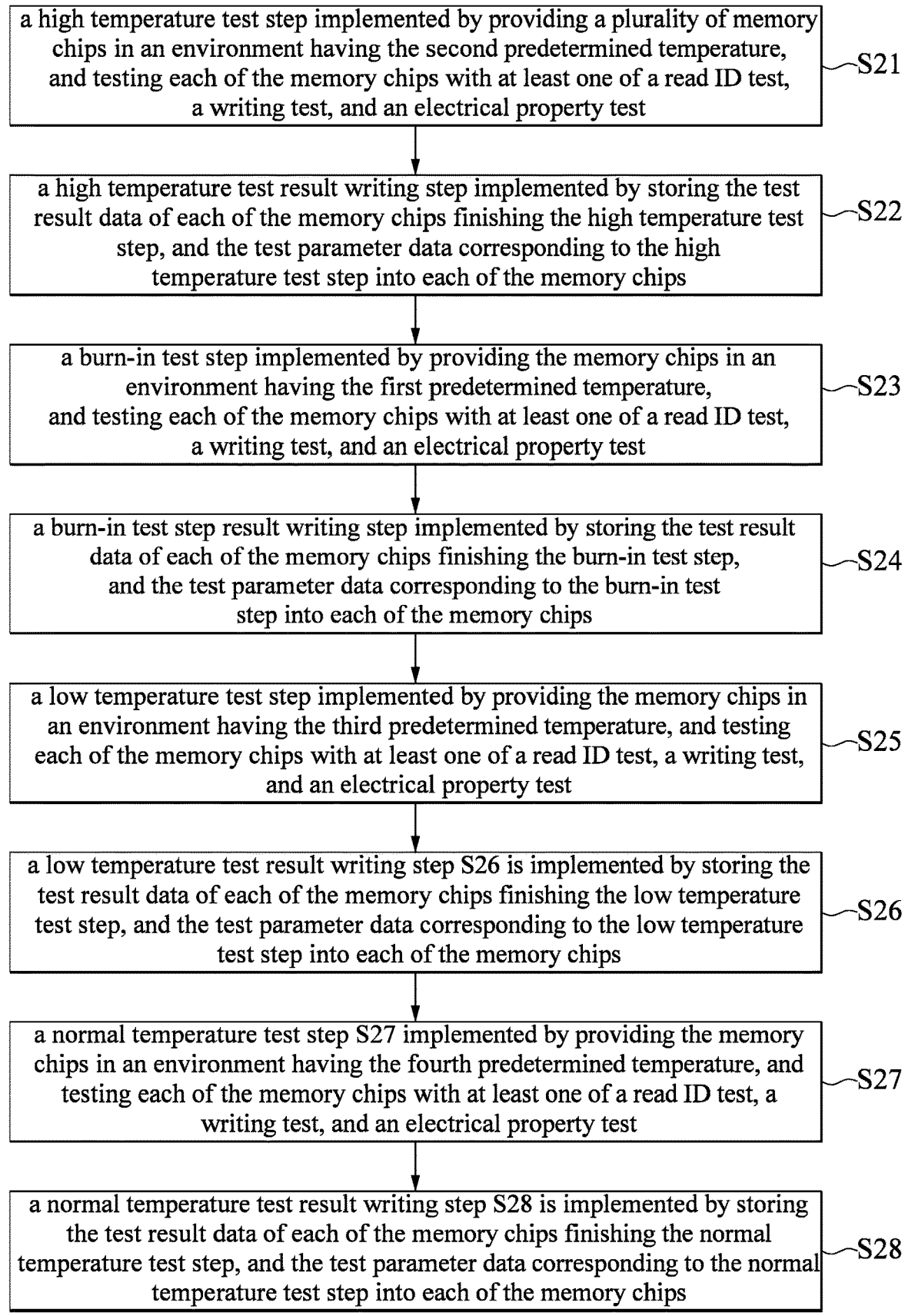
FIG. 4 is a flowchart of the memory test method of the present disclosure according to a fourth embodiment of the present disclosure.

Referring to FIG. 4, FIG. 4 is a flowchart of the memory test method of the present disclosure according to a fourth embodiment of the present disclosure. The memory test method includes a high temperature test step S21, a high temperature test result writing step S22, a burn-in test step S23, a burn-in test step result writing step S24, a low temperature test step S25, a low temperature test result writing step S26, a normal temperature test step S27, and a normal temperature test result writing step S28. Specifically, the above steps S21~S28 are disclosed as follows.

The high temperature test step S21 is implemented by providing a plurality of memory chips in an environment having the second predetermined temperature, and testing each of the memory chips with at least one of a reading test, a writing test, and an electrical property test.

The high temperature test result writing step S22 is implemented by storing the test result data of each of the memory chips after finishing the high temperature test step and the test parameter data corresponding to the high temperature test step into each of the memory chips.

The burn-in test step S23 is implemented by providing memory chips in an environment having the first predetermined temperature, and testing each of the memory chips with at least one of a reading test, a writing test, and an electrical property test.

The burn-in test step result writing step S24 is implemented by storing the test result data of each of the memory chips after finishing the burn-in test step and the test parameter data corresponding to the burn-in test step into each of the memory chips.

The low temperature test step S25 is implemented by providing the memory chips in an environment having the third predetermined temperature, and testing each of the memory chips with at least one of a reading test, a writing test, and an electrical property test.

The low temperature test result writing step S26 is implemented by storing the test result data of each of the memory chips after finishing the low temperature test step and the test parameter data corresponding to the low temperature test step into each of the memory chips.

The normal temperature test step S27 is implemented by providing the memory chips in an environment having the fourth predetermined temperature, and testing each of the memory chips with at least one of a reading test, a writing test, and an electrical property test.

The normal temperature test result writing step S28 is implemented by storing the test result data of each of the memory chips after finishing the normal temperature test step and the test parameter data corresponding to the normal temperature test step into each of the memory chips.

The first predetermined temperature can be within a range of 30° C. to 200° C. The second predetermined temperature can be within a range of 30° C. to 130° C. The third predetermined temperature can be within a range of −55° C. to 30° C. The fourth predetermined temperature can be determined according to practical requirements. For example, the fourth predetermined temperature can be an ambient temperature that is within a range of 20° C. to 30° C.

In other embodiments of the present disclosure, the sequence of the steps S11~S18 can be changed as below: the high temperature test step S13, the high temperature test result writing step S14, the burn-in test step S11, the burn-in test step result writing step S12, the normal temperature test step S17, the normal test result writing step S18, the low temperature test step S15, and the low temperature test result writing step S16.

In other embodiments of the present disclosure, the sequence of the steps S11~S18 can be changed as below: the low temperature test step S15, the low temperature test result writing step S16, the normal temperature test step S17, the normal test result writing step S18, the high temperature test step S13, the high temperature test result writing step S14, the burn-in test step S11, and the burn-in test step result writing step S12.

In other embodiments of the present disclosure, the sequence of the steps S11~S18 can be changed as below: the normal temperature test step S17, the normal test result writing step S18, the low temperature test step S15, the low temperature test result writing step S16, the high temperature test step S13, the high temperature test result writing step S14, the burn-in test step S11, and the burn-in test step result writing step S12.

In other embodiments of the present disclosure, the sequence of the steps S11~S18 can be changed as below: the low temperature test step S15, the low temperature test result writing step S16, the high temperature test step S13, the high temperature test result writing step S14, the burn-in test step S11, the burn-in test step result writing step S12, the normal temperature test step S17, and the normal test result writing step S18.

In other embodiments of the present disclosure, the sequence of the steps S11~S18 can be changed as below: the normal temperature test step S17, the normal test result writing step S18, the high temperature test step S13, the high temperature test result writing step S14, the burn-in test step S11, the burn-in test step result writing step S12, the low temperature test step S15, and the low temperature test result writing step S16.

It is worth mentioning that, in other embodiments of the present disclosure, the memory test method is not limited to include the low temperature test step S15 and the low temperature test result writing step S16. The memory test method can include the normal temperature test step S17, the normal temperature test result writing step S18, the high temperature test step S13, the high temperature test result writing step S14, the burn-in test step S11, and the burn-in test step result writing step S12. Or, the memory test method can include the high temperature test step S13, the high temperature test result writing step S14, the burn-in test step S11, the burn-in test step result writing step S12, the normal temperature test step S17, and the normal temperature test result writing step S18.

Referring to FIG. 5, FIG. 5 is a flowchart of the memory test method of the present disclosure according to a fifth embodiment of the present disclosure. The memory test method includes a test and record step S31 and a test result writing step S32. Specifically, the above steps S31 and S32 are disclosed as follows.

The test and record step S31 is implemented by providing a plurality of memory chips in an environment having at least one predetermined temperature, testing each of the memory chips with at least one of a reading test, a writing test, and an electrical property test, and recording the corresponding test result data and the test parameter data of each of the memory chips after finishing the at least one of a reading test, a writing test, and an electrical property test in the different predetermined temperature environments.

The test result writing step S32 is implemented by storing the test result data and the test parameter data corresponding to each of the memory chips into each of the memory chips so that each of the memory chips stores the corresponding test result data and the test parameter data.

In a practical application, the test and record step S31 can include a burn-in test and record step S311 and a high temperature test and record step S312 according to practical requirements. Specifically, the above steps S311 and S312 are disclosed as follows.

The burn-in test and record step S311 is implemented by providing the memory chips in an environment having a first predetermined temperature, testing each of the memory chips with at least one of a reading test, a writing test, and an electrical property test, and recording the corresponding test result data and the test parameter data of each of the memory chips after finishing the at least one of a reading test, a writing test, and an electrical property test in the environments.

The high temperature test and record step S312 is implemented by providing the memory chips in an environment having a second predetermined temperature, testing each of the memory chips with at least one of a reading test, a writing test, and an electrical property test, and recording the corresponding test result data and the test parameter data of each of the memory chips after finishing the at least one of a reading test, a writing test, and an electrical property test in environments under the second predetermined temperature.

In a practical application, the first predetermined temperature can be within a range of 30° C. to 200° C., and the second predetermined temperature can be within a range of 30° C. to 130° C. In other embodiments of the present disclosure, the sequence of the burn-in test and record step S311 and the high temperature test step S312 can be changed with each other. That is to say, in other embodiments of the present disclosure, the high temperature test and record step S312 can be implemented before the burn-in test and record test S311 is implemented.

In other embodiments of the present disclosure, the test and record step S31 can include a burn-in test and record step S311, a high temperature test and record step S312, and a low temperature test and record step S313 according to practical requirements. Specifically, the above steps S311~S313 are disclosed as follows.

The burn-in test and record step S311 is implemented by providing the memory chips in an environment having a first predetermined temperature, testing each of the memory chips with at least one of a reading test, a writing test, and an electrical property test, and recording the corresponding test result data and the test parameter data of each of the memory chips after finishing the at least one of a reading test, a writing test, and an electrical property test in environments under the first predetermined temperature.

The high temperature test and record step S312 is implemented by providing the memory chips in an environment having a second predetermined temperature, testing each of the memory chips with at least one of a reading test, a writing test, and an electrical property test, and recording the corresponding test result data and the test parameter data of each of the memory chips after finishing the at least one of a reading test, a writing test, and an electrical property test in environments under the second predetermined temperature.

The low temperature test and record step S313 is implemented by providing the memory chips in an environment having a third predetermined temperature, testing each of the memory chips with at least one of a reading test, a writing test, and an electrical property test, and recording the corresponding test result data and the test parameter data of each of the memory chips after finishing the at least one of a reading test, a writing test, and an electrical property test in environments under the third predetermined temperature.

In a practical application, the first predetermined temperature can be within a range of 30° C. to 200° C., the second predetermined temperature can be within a range of 30° C. to 130° C., and the third predetermined temperature can be within a range of −55° C. to 30° C. In other embodiments of the present disclosure, the sequence of the steps S311~S313 can be changed as below: the low temperature test and record step S313, the high temperature test and record step S312, and the burn-in test and record step S311.

In other embodiments of the present disclosure, the test and record step S31 can include a burn-in test and record step S311, a high temperature test and record step S312, a low temperature test and record step S313, and a normal temperature test and record step S314 according to practical requirements. Specifically, the above steps S311~S314 are disclosed as follows.

The burn-in test and record step S311 is implemented by providing the memory chips in an environment having a first predetermined temperature, testing each of the memory chips with at least one of a reading test, a writing test, and an electrical property test, and recording the corresponding test result data and the test parameter data of each of the memory chips after finishing the at least one of a reading test, a writing test, and an electrical property test in environments under the first predetermined temperature.

The high temperature test and record step S312 is implemented by providing the memory chips in an environment having a second predetermined temperature, testing each of the memory chips with at least one of a reading test, a writing test, and an electrical property test, and recording the corresponding test result data and the test parameter data of each of the memory chips after finishing the at least one of a reading test, a writing test, and an electrical property test in environments under the second predetermined temperature.

The low temperature test and record step S313 is implemented by providing the memory chips in an environment having a third predetermined temperature, testing each of the memory chips with at least one of a reading test, a writing test, and an electrical property test, and recording the corresponding test result data and the test parameter data of each of the memory chips after finishing the at least one of a reading test, a writing test, and an electrical property test in environments under the third predetermined temperature.

The normal temperature test and record step S314 is implemented by providing the memory chips in an environment having a fourth predetermined temperature, testing each of the memory chips with at least one of a reading test, a writing test, and an electrical property test, and recording the corresponding test result data and the test parameter data of each of the memory chips after finishing the at least one of a reading test, a writing test, and an electrical property test in environments under the fourth predetermined temperature.

In a practical application, the first predetermined temperature can be within a range of 30° C. to 200° C., the second predetermined temperature can be within a range of 30° C. to 130° C., the third predetermined temperature can be within a range of −55° C. to 30° C., and the fourth predetermined temperature can be an ambient temperature that is within a range of 20° C. to 30° C.

In other embodiments of the present disclosure, the sequence of the steps S311~S314 can be changed as below: the high temperature test and record step S312, the burn-in test and record step S311, the normal temperature test and record step S314, and the low temperature test and record step S313.

In other embodiments of the present disclosure, the sequence of the steps S311~S314 can be changed as below: the low temperature test and record step S313, the normal temperature test and record step S314, the high temperature test and record step S312, and the burn-in test and record step S311.

In other embodiments of the present disclosure, the sequence of the steps S311~S314 can be changed as below: the normal temperature test and record step S314, the low temperature test and record step S313, the high temperature test and record step S312, and the burn-in test and record step S311.

In other embodiments of the present disclosure, the sequence of the steps S311~S314 can be changed as below: the low temperature test and record step S313, the high temperature test and record step S312, the burn-in test and record step S311, and the normal temperature test and record step S314.

In other embodiments of the present disclosure, the sequence of the steps S311~S314 can be changed as below: the normal temperature test and record step S314, the high temperature test and record step S312, the burn-in test and record step S311, and the low temperature test and record step S313.

It is worth mentioning that, in other embodiments of the present disclosure, the memory test method is not limited to include the low temperature test and record step S313. The memory test method can include the normal temperature test and record step S314, the high temperature test and record step S312, and the burn-in test and record step S311. Or, the memory test method can include the high temperature test and record step S312, the burn-in test and record step S311, and the normal temperature test and record step S314. Or, the memory test method can include the burn-in test and record step S311, the high temperature test and record step S312, and the normal temperature test and record step S314.

As mentioned above, in the memory test method of the previous embodiments, after the memory chips finish any one of the tests (e.g., the burn-in test, the high temperature test, and the low temperature test), the related test result data and the test parameter data are immediately stored. However, in the memory test method of the present embodiment, after all of the memory chips finish all of the tests, all of the test result data and all of the related test parameter data are stored into the memory chips at the same time. When the memory chips are in the testing process, the related test result data and the test parameter data are stored into other temporary storage units.

Figure 6:
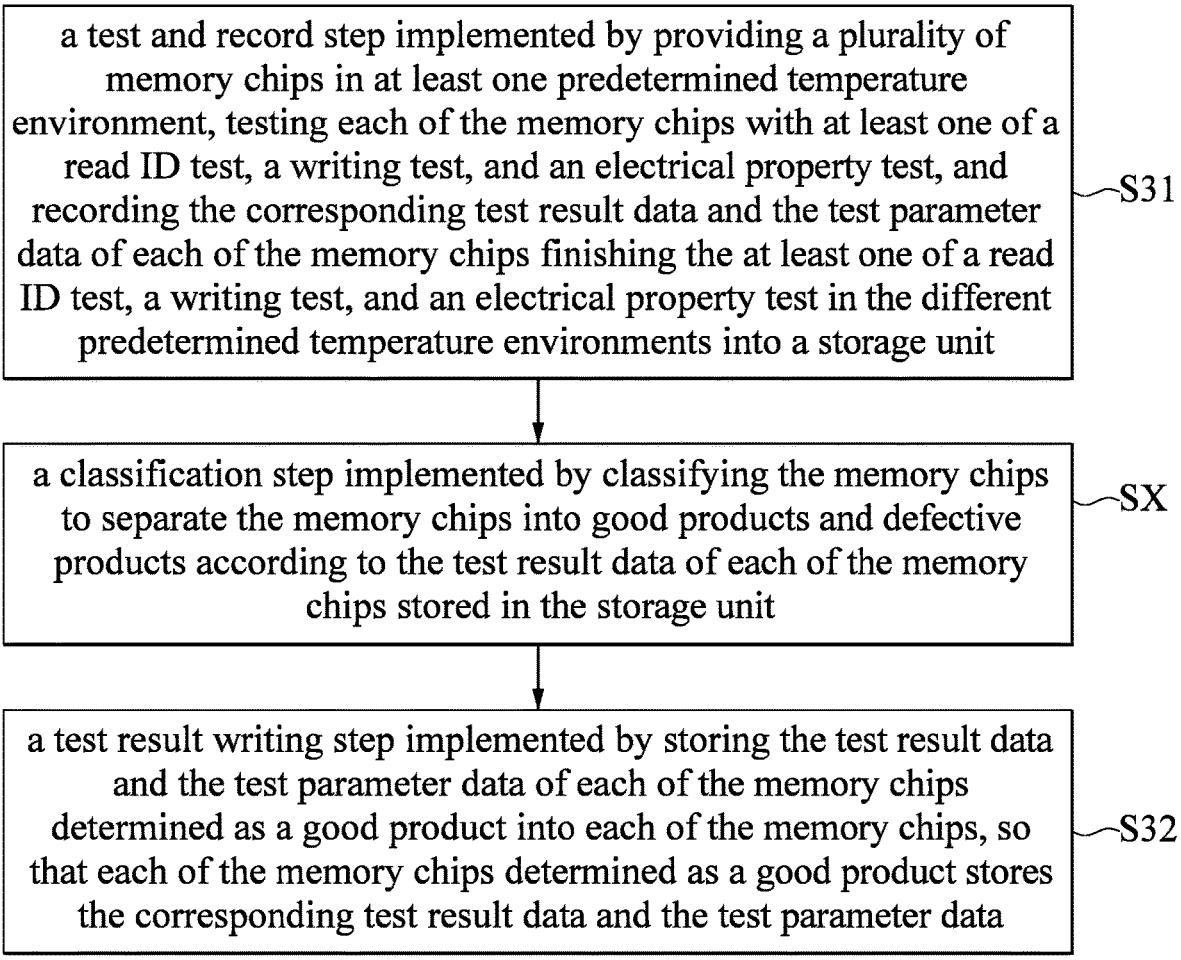
FIG. 6 is a flowchart of the memory test method of the present disclosure according to a sixth embodiment of the present disclosure.

Referring to FIG. 6, FIG. 6 is a flowchart of the memory test method of the present disclosure according to a sixth embodiment of the present disclosure. The memory test method includes a test and record step S31, a classification step SX, and a test result writing step S32. Specifically, the above steps S31, SX, and S32 are disclosed as follows.

The test and record step S31 is implemented by providing a plurality of memory chips in an environment having at least one predetermined temperature, testing each of the memory chips with at least one of a reading test, a writing test, and an electrical property test, and recording the corresponding test result data and the test parameter data of each of the memory chips after finishing the at least one of a reading test, a writing test, and an electrical property test in the different predetermined temperature environments into a storage unit.

The classification step SX is implemented by classifying the memory chips, and separating the memory chips into good products and defective products according to the test result data of each of the memory chips stored in the storage unit.

The test result writing step S32 is implemented by storing the test result data and the test parameter data of each of the memory chips determined as a good product into each of the memory chips, so that each of the memory chips determined as a good product stores the corresponding test result data and the test parameter data.

As mentioned above, in the memory test method of the previous embodiments, after the memory chips finish any of the tests or all of the tests, the related test result data and the test parameter are stored in the memory chips regardless of the test result. However, in the memory test method of the present embodiment, only memory chips that passed the tests store the corresponding test result data and the test parameter data.

Figure 7:
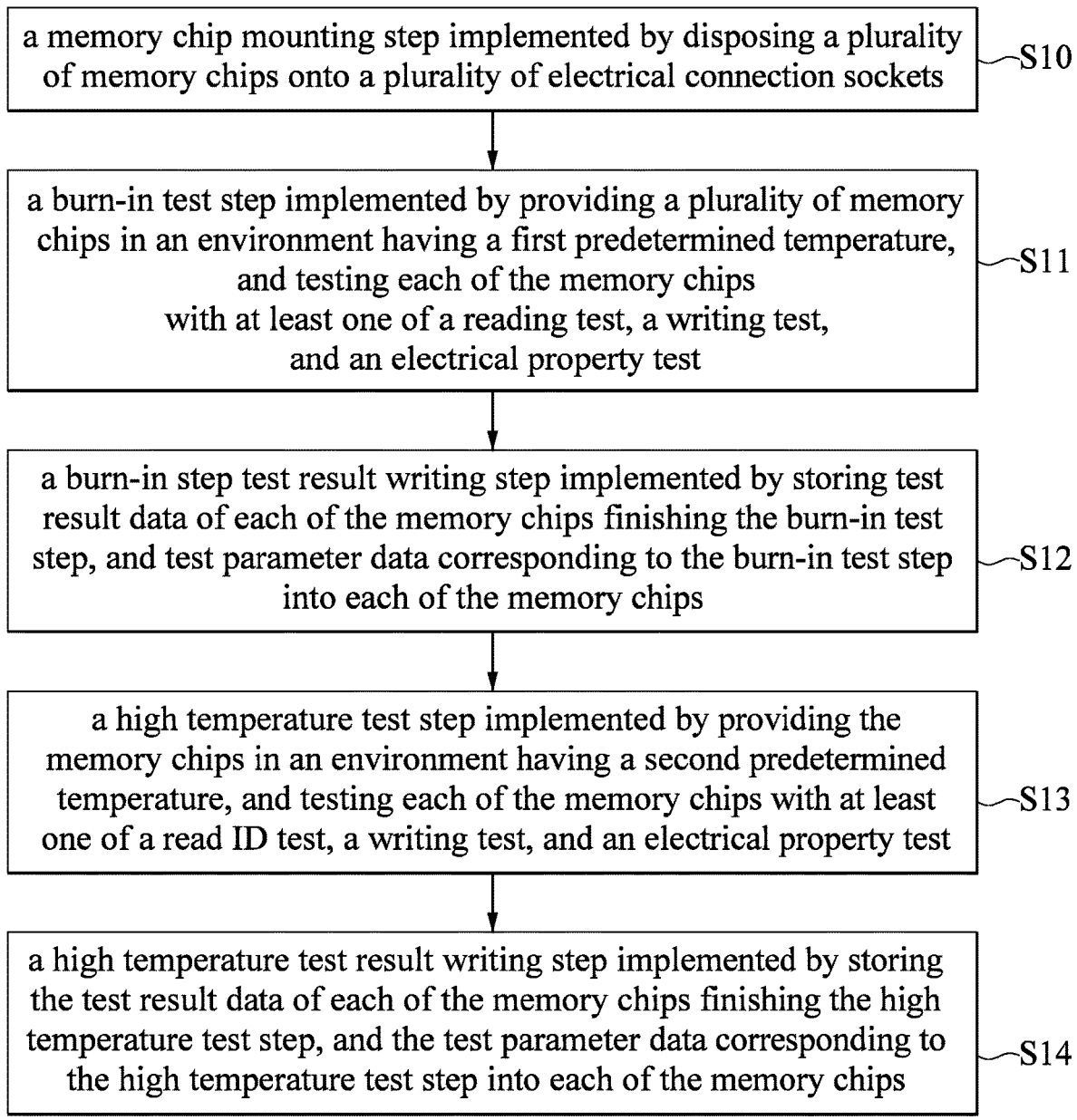
FIG. 7 is a flowchart of the memory test method of the present disclosure according to a seventh embodiment of the present disclosure.

Referring to FIG. 7, FIG. 7 is a flowchart of the memory test method of the present disclosure according to a seventh embodiment of the present disclosure. The difference between the present disclosure and the mentioned first embodiment is that before the burn-in test step S11, the memory test method can further include a memory chip mounting step S10. The memory chip mounting step S10 is implemented by disposing a plurality of memory chips onto a plurality of electrical connection sockets.

Figure 8:
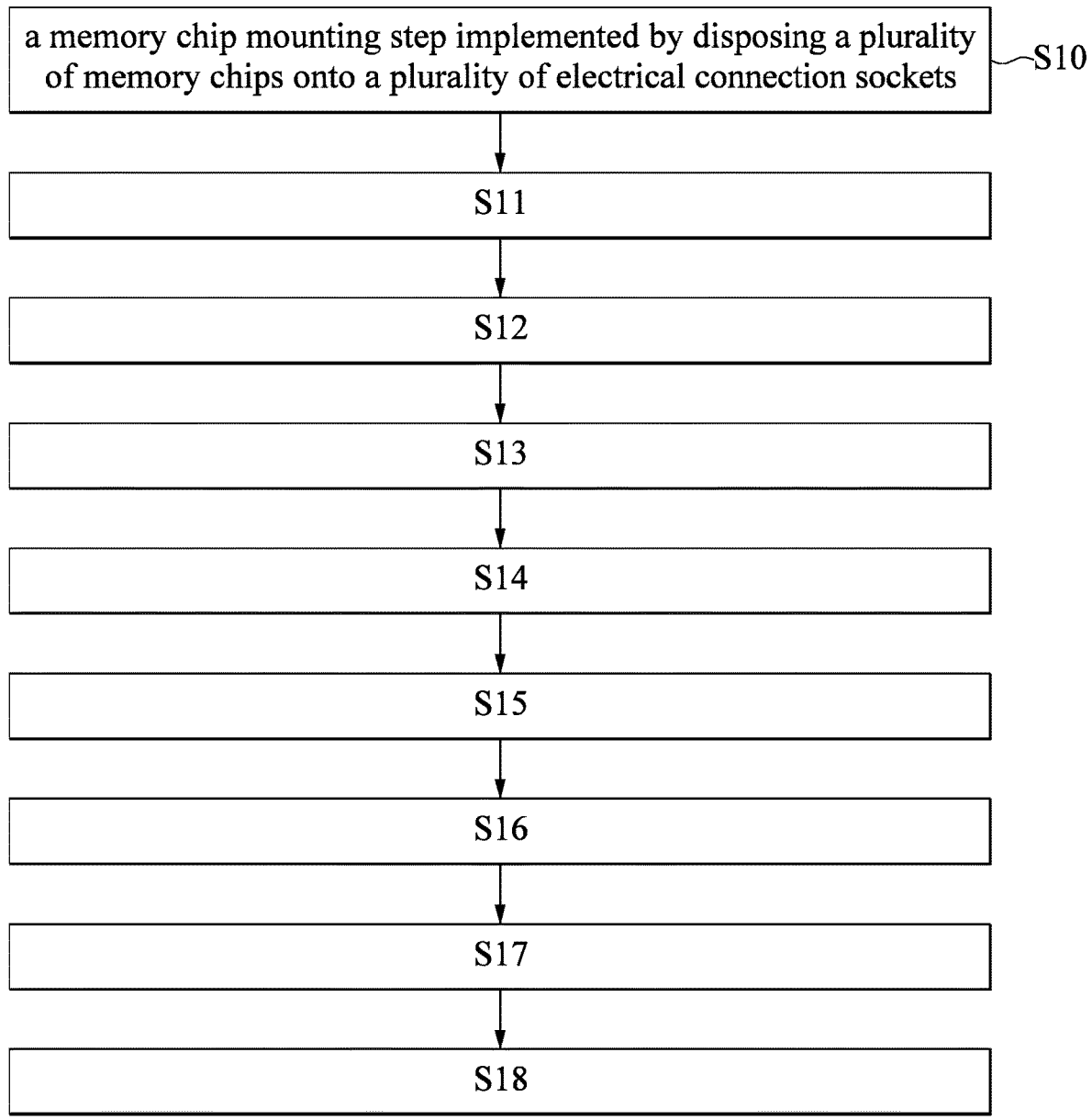
FIG. 8 is a flowchart of the memory test method of the present disclosure according to an eighth embodiment of the present disclosure.

Referring to FIG. 8, FIG. 8 is a flowchart of the memory test method of the present disclosure according to an eighth embodiment of the present disclosure. The difference between the present disclosure and the mentioned third embodiment is that before the burn-in test step S11, the memory test method can further include a memory chip mounting step S10. The memory chip mounting step S10 is implemented by disposing a plurality of memory chips onto a plurality of electrical connection sockets.

Figure 9:
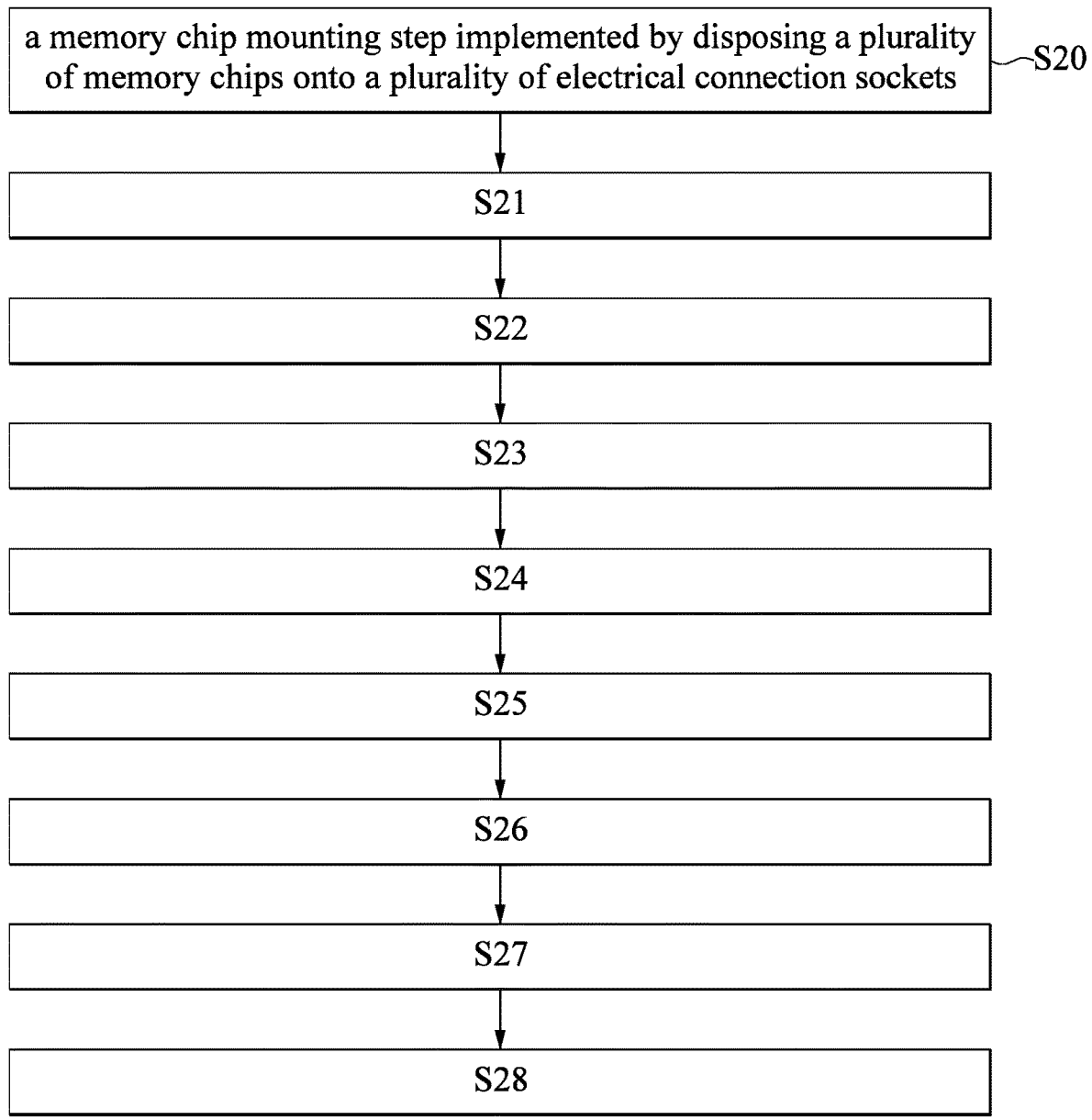
FIG. 9 is a flowchart of the memory test method of the present disclosure according to a ninth embodiment of the present disclosure.

Referring to FIG. 9, FIG. 9 is a flowchart of the memory test method of the present disclosure according to a ninth embodiment of the present disclosure. The difference between the present disclosure and the mentioned fourth embodiment is that before the high temperature test step S21, the memory test method can further include a memory chip mounting step S20. The memory chip mounting step S20 is implemented by disposing a plurality of memory chips onto a plurality of electrical connection sockets.

Figure 10:
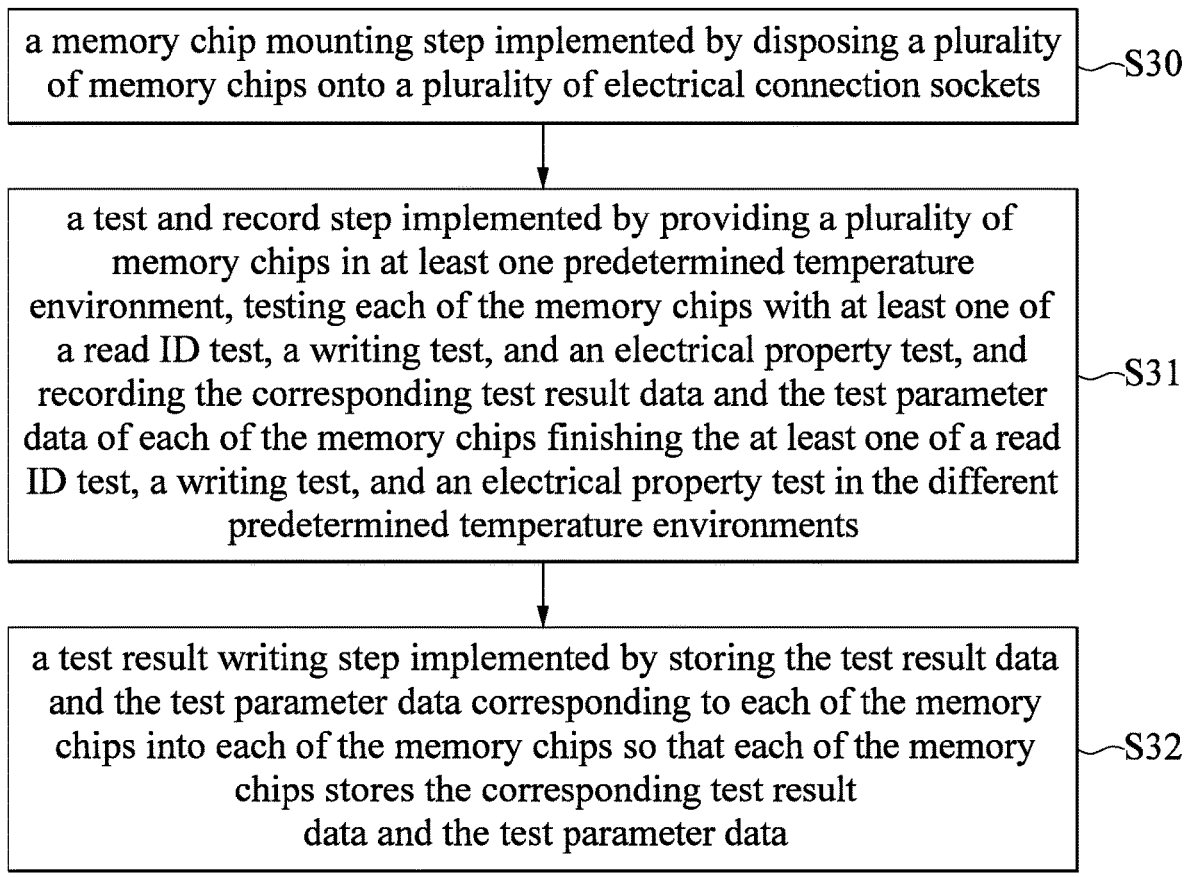
FIG. 10 is a flowchart of the memory test method of the present disclosure according to a tenth embodiment of the present disclosure.

Referring to FIG. 10, FIG. 10 is a flowchart of the memory test method of the present disclosure according to a tenth embodiment of the present disclosure. The difference between the present disclosure and the mentioned fifth embodiment is that before the test and record step S31, the memory test method can further include a memory chip mounting step S30. The memory chip mounting step S30 is implemented by disposing a plurality of memory chips onto a plurality of electrical connection sockets.

Figure 11:
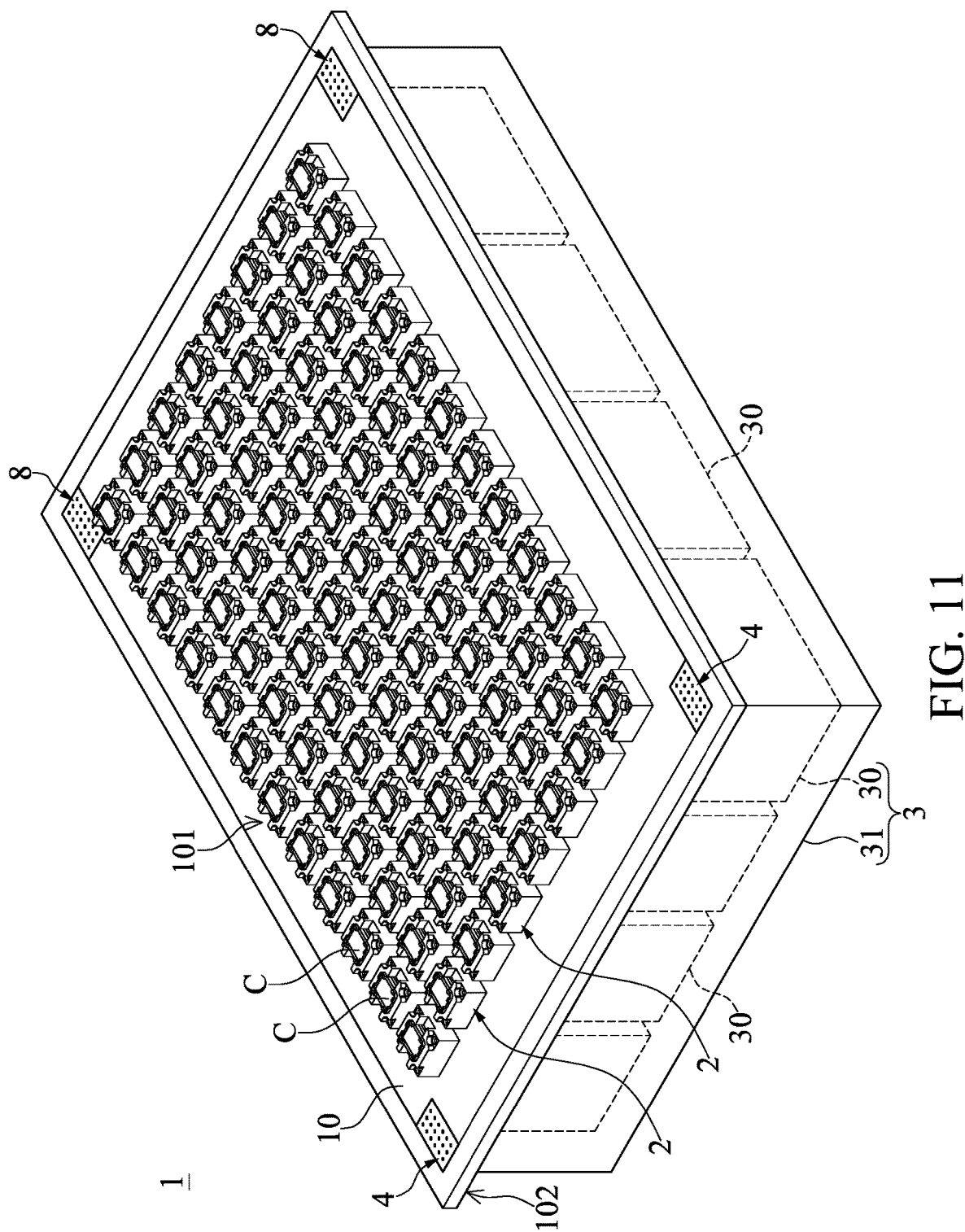
FIG. 11 is a schematic view of a chip testing device of the present disclosure.
Figure 12:
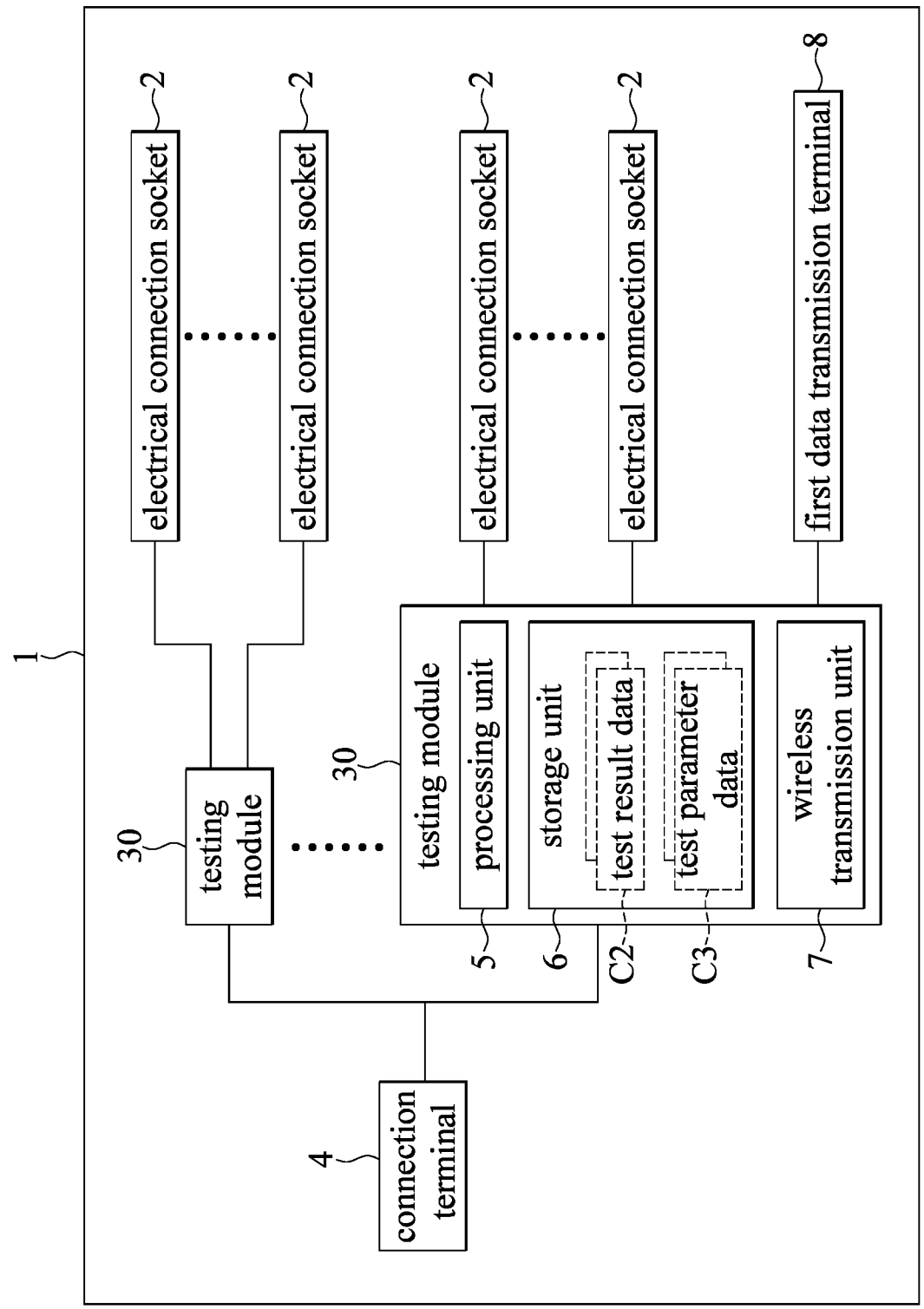
FIG. 12 is a block diagram of the chip testing device of the present disclosure.
Figure 13:
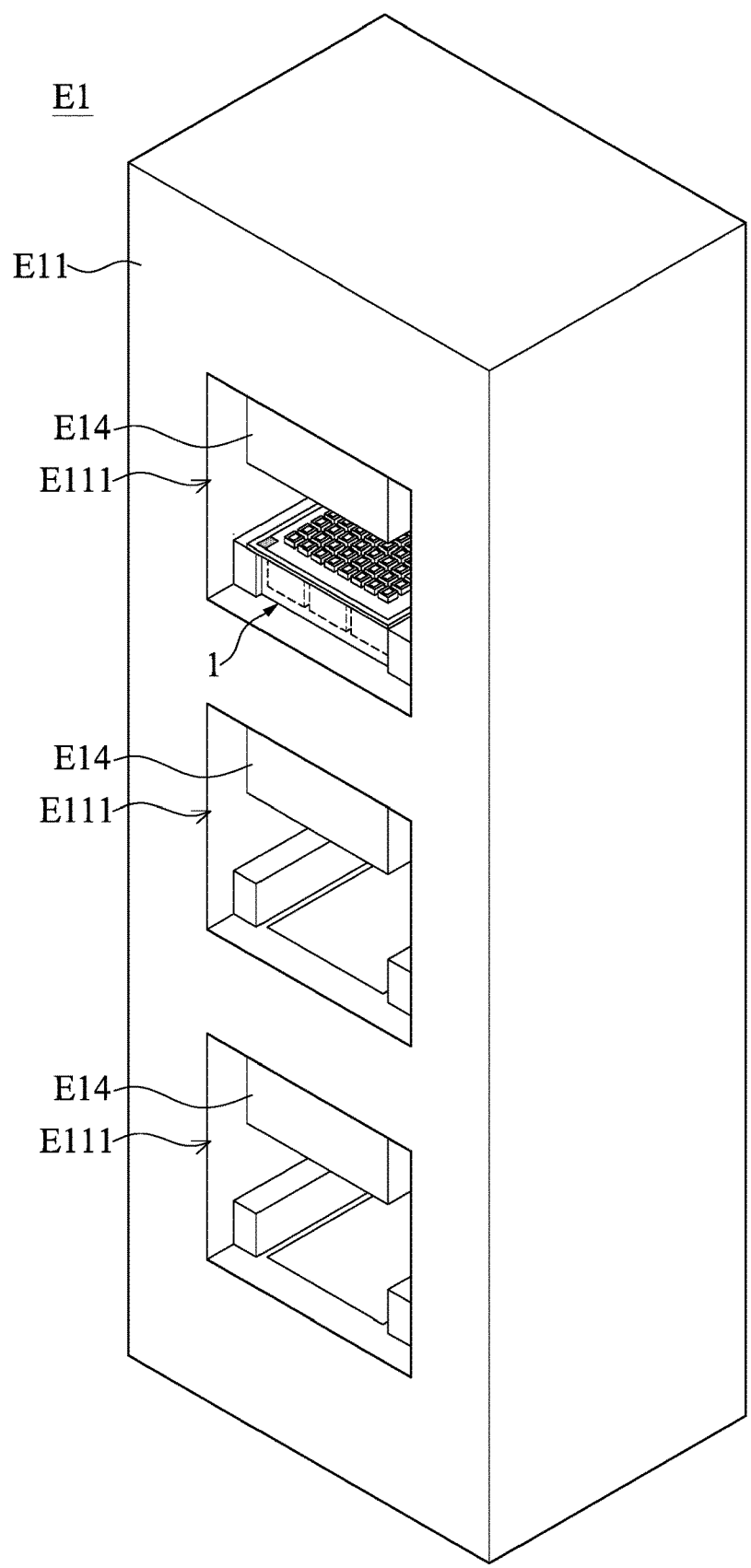
FIG. 13 is a schematic view of an environment control apparatus of the present disclosure.
Figure 14:
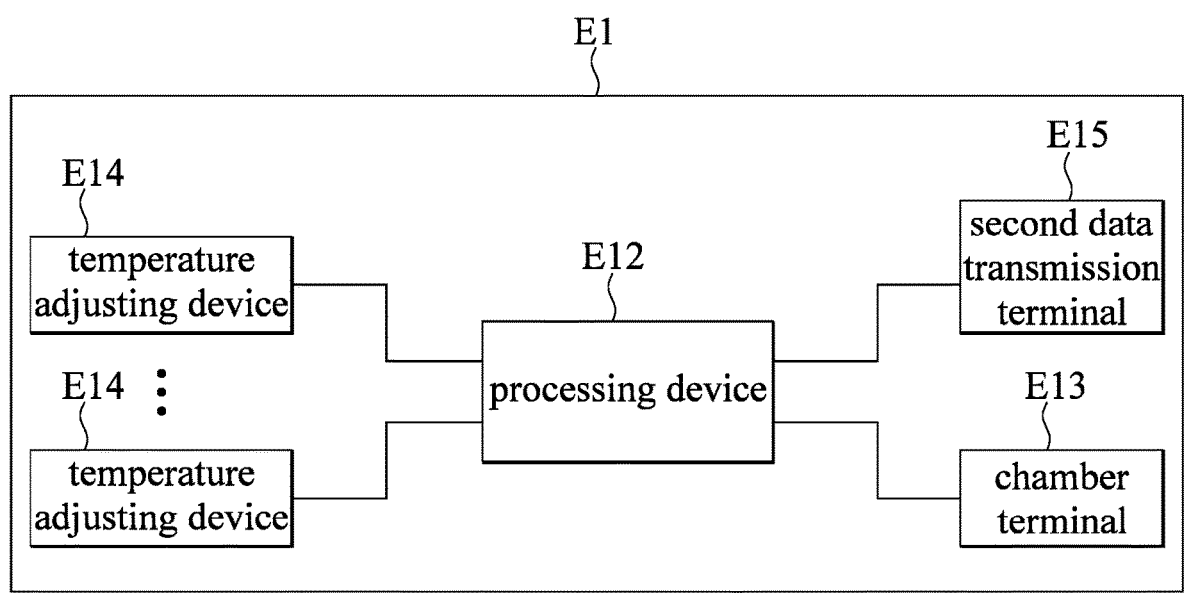
FIG. 14 is a block diagram of the environment control apparatus of the present disclosure.

Referring to FIG. 11 to FIG. 14, FIG. 11 and FIG. 12 are respectively a schematic view and a block diagram of the chip testing device of the present disclosure. FIG. 13 and FIG. 14 are respectively a schematic view and a block diagram of an environment control apparatus of the present disclosure.

As shown in FIG. 11 and FIG. 12, a chip testing device 1 can include a circuit board 10, a plurality of electrical connection sockets 2, a control set 3, and a power supply member. The circuit board 10 has a first board surface 101 and a second board surface 102 respectively defined by two opposite sides of the circuit board 10. The electrical connection sockets 2 are fixed onto the first board surface 101 of the circuit board 10, and each of the electrical connection sockets 2 is configured to carry one of a plurality of memory chips C. The structure of the electrical connection socket 2 can be changed according different memory chips, and the present disclosure is not limited thereto. The chip testing device 1 is configured to be transferred by a transferring device (such as a robotic arm) so that the chip testing device 1 is configured to be moved among a plurality of different working stations (such as an environment control apparatus E1).

The electrical connection sockets are divided into a plurality of socket groups, and each of the socket groups includes at least one of the electrical connection sockets 2. The control set 3 is disposed onto the second board surface 102 of the circuit board 10. The control set 3 includes a plurality of testing modules 30. The testing modules 30 are correspondingly connected to the socket groups, and each of the testing modules 30 is connected to the at least one electrical connection socket 2 of the corresponding socket group.

More specifically, as shown in FIG. 11 of the present embodiment, the number of the electrical connection sockets 2 disposed onto the circuit board 10 is ninety six, and the ninety six electrical connection sockets 2 can be divided into sixteen socket groups. That is to say, each of the socket groups has six of the electrical connection sockets 2 connected to the same testing module 30. In addition, the number of the electrical connection sockets 2 disposed onto the circuit board 10 and the number of the socket groups can be changed according to practical requirements.

After each of the testing modules 30 is provided with electricity by the power supply member, each of the testing modules 30 is configured to perform a predetermined testing process (i.e., at least one of a reading test, writing test, and an electrical property test) on the memory chips C disposed onto the electrical connection sockets 2 connected thereto. In an embodiment of the present disclosure about each of the testing modules 30 used for testing the memory chips C, each of the testing modules 30 can include a pattern generator (PG), a parametric measurement unit (PMU), a device power supplies (DPS), and a driver.

Since the electrical connection sockets 2 disposed onto the circuit board 10 are respectively connected to the testing modules 30, a signal transmission between the testing modules 30 and the memory chips C disposed onto the electrical connection sockets 2 connected to the testing modules 30 can be faster and is not easy to decay. More specifically, if the circuit board 10 provided with the ninety six electrical connection sockets 2 is only connected to a single signal input source, and a signal emitted from the signal input source is transmitted across the circuit board 10, the signal would have a decay issue that may cause a test result of the memory chips C disposed onto the electrical connection sockets 2 to be inaccurate.

The power supply member can include a plurality of connection terminals 4, and the connection terminals 4 are connected to the circuit board 10. The structure of each of the connection terminals 4 can be changed according to practical requirements. For example, the connection terminals 4 can be pogo pins or board-to-board connectors, but the present disclosure is not limited thereto. As shown in FIG. 11 of the present embodiment, the connection terminals 4 are disposed onto the first board surface 101 of the circuit board 10, but the position where the connection terminals 4 are disposed is not limited thereto. According to practical requirements, the connection terminals 4 can be disposed on any positions of the circuit board 10.

It should be noted that the electrical connection sockets 2 respectively belonging to different socket groups are not limited to be connected with each other. If the chip testing device 1 fails, the socket groups can be tested one by one for quickly finding a broken electrical connection socket 2, and the chip testing device 1 can be repaired by simply replacing the broken electrical connection socket 2, components of the broken electrical connection socket 2, the socket group having the broken electrical connection socket 2, or the testing module 30 corresponding to the broken electrical connection socket 2. Accordingly, the chip testing device 1 can be repaired without replacing all of the electrical connection sockets 2 and all of the testing modules 30 on the circuit board 10.

In a practical application, the chip testing device 1 can further include a chassis 31 fixed onto the second board surface 102 of the circuit board 10 so as to cover and protect the testing modules 30. In other embodiments of the present disclosure, the chip testing device 1 can include a plurality of chassis 31, and each of the chassis 31 correspondingly covers a testing module 30. In a practical application, the chassis 31 can be provided with a heat dissipating device (e.g., a fan or heat dissipation fins) according to practical requirements.

The connection terminals 4 are configured to be connected to an external power supply apparatus, and the external power supply apparatus can provide electricity to each of the testing modules 30 through the connection terminals 4. The external power supply apparatus is independent from the chip testing device 1 and can be any apparatus enabled to provide electricity, but the present disclosure is not limited thereto. That is to say, when the chip testing device 1 is not connected to the external power supply apparatus through the connection terminals 4, any one of the testing modules 30 has no electricity to perform the predetermined testing process on at least one of the memory chips C that is connected to the corresponding one of the testing modules 30. Naturally, in other embodiments of the present disclosure, the chip testing device 1 can be provided with a charging battery connected to the testing modules 30, and the charging battery can provide electricity to the testing modules 30 so that each of the testing modules 30 can perform the predetermined testing process on the memory chips C.

As shown in FIG. 11, the power supply member includes the connection terminals 4, and the chip testing device 1 is connected to the external power supply apparatus by contacting with the connection terminals 4. However, the structure of the power supply member is not limited thereto. For example, the power supply member can be a receiving antenna. The receiving antenna and an emitting antenna of the external power supply apparatus can be coupled with each other, and the chip testing device 1 can receive electricity provided by the external power supply apparatus in a wireless manner through the receiving antenna.

As shown in FIG. 13 and FIG. 14, FIG. 13 is the schematic view of the environment control apparatus E1 of the present disclosure. FIG. 14 is the block diagram of the environment control apparatus E1 of the present disclosure. Through each of the environment control apparatuses E1, the predetermined process can be performed on the memory chips C disposed onto the chip testing device 1 in an environment having the first predetermined temperature, the second predetermined temperature and the third predetermined temperature.

Each of the environment control apparatuses E1 includes an apparatus body E11, a processing device E12, a plurality of chamber terminals E13, and a plurality of temperature adjusting devices E14. The apparatus body E11 includes a plurality of accommodating chambers E111, and each of the accommodating chambers E111 can accommodate the chip testing device 1. The chamber terminals E13 are disposed in each of the accommodating chambers E111, and the chamber terminals E13 can be connected to the connection terminals 4 of the chip testing device 1. The positions where the chamber terminals E13 are disposed can be designed according to the position where the chip testing device 1 is disposed in the accommodating chamber E111 and the position of the connection terminals 4, and the present disclosure in not limited thereto. In a practical application, a lift structure (not shown) can be disposed in the accommodating chamber E111. The lift structure is controllable to move the chip testing device 1 in the accommodating chamber E111 so that the connection terminals 4 of the chip testing device 1 and the chamber terminals E13 can be connected with each other. Naturally, in an embodiment of the present disclosure with the receiving antenna being the power supply member, it can be that no lift structure nor chamber terminals E13 are disposed in each of the accommodating chambers E111, and the emitting antenna is correspondingly disposed in the accommodating chamber E111.

The processing device E12 is connected to the chamber terminals E13 of each of the accommodating chambers E111. In a practical application, the chamber terminals E13 can be pogo pins. When each of the chamber terminals E13 is connected to the chamber terminals 4, each of the chamber terminals E13 correspondingly generates a signal. Therefore, the processing device E12 can receive the signal informing the connection terminals 4 of the chip testing device 1 are connected to the chamber terminals E13 of one of the accommodating chamber E111. Each of the temperature adjusting devices E14 is connected to the processing device E12. Each of the temperature adjusting devices E14 can be controlled by the processing device E12 so that the environment temperature of the memory chips C disposed onto the electrical connection sockets 2 of the chip testing device 1 in the corresponding accommodating chamber E111 reaches a predetermined temperature.

As mentioned above, in a practical application, the environment control apparatus E1 can be connected to a central control device, and the central control device can be connected to a transferring device. The central control device can control the transferring device to clamp the chip testing device 1 carrying the memory chips C so that the chip testing device 1 can be transferred to any of the accommodating chambers E111 of the environment control apparatuses E1. When the chip testing device 1 is disposed in the accommodating chamber E111, the central control device can control the environment control apparatus E1 so as to control the temperature adjusting devices E14 of the accommodating chambers E111, so that the temperature adjusting devices E14 of the accommodating chambers E111 can be operated. Therefore, the memory chips C carried by the chip testing device 1 can be in an environment having the first predetermined temperature, the second predetermined, the third predetermined temperature, or the fourth predetermined temperature.

In a practical application, each of the accommodating chambers E111 of the environment control apparatus E1 can be controlled to be only in a predetermined temperature range. For example, a temperature of one of the accommodating chambers E111 can be maintained to be within a range of 30° C. to 130° C., a temperature of another one of the accommodating chambers E111 can be maintained to be below 0° C., and a temperature of another one of the accommodating chambers E111 can be maintained to be within a range of 20° C. to 30° C. (e.g., an ambient temperature). Therefore, when the memory test method of the above embodiments is implemented by the central control device, the chip testing device 1, and the environment control apparatus E1, the central control device can transfer the chip testing device 1 to the accommodating chamber E111 with a different temperature range according to temperature requirements of each of the steps.

In a practical application, the test result data C2 can include test information of the memory chips in the high temperature test, the burn-in test, and the low temperature test. Or, the test result data C2 can only record whether the memory chips C pass the high temperature test, the burn-in test, and the low temperature test.

When implementing the memory test method through the chip testing device 1 and the environment control apparatus E1, the test parameter data C3 can include: ID number of the chip testing device 1, ID number of the testing module 30, ID number of the electrical connection socket 2, ID number of the environment control apparatus E1, ID number of the accommodating chamber E111, time and temperature in the high temperature test, time and temperature in the burn-in test, time and temperature in the low temperature test, and time, temperature, and date in the normal temperature test.

When implementing the memory test method through the chip testing device 1 and the environment control apparatus E1, the test result data C2 and test parameter data C3 corresponding to each of the memory chips C can be stored into each of the memory chips C through the corresponding testing modules 30. That is to say, the testing modules 30 can be controlled to perform a reading test, a writing test, and an electrical property test on the memory chips C, and after the testing modules 30 finish each of the tests on the memory chips C, the testing modules 30 can directly store the corresponding test result data C2 and the test parameter data C3 into the memory chips C.

Since the test result data C2 and the test parameter data C3 are stored into the memory chips C through the testing module 30, when a consumer obtains any one of the memory chips C, the consumer can confirm a testing state during a process of manufacture of the memory chip C by using a relevant apparatus to read the data stored in the memory chip C. Moreover, when a production staff receives a memory chip C sent back from a consumer, the testing state of the memory chip C can be quickly obtained by reading the test result data C2 and the test parameter data C3 stored in the memory chip C, thereby effectively helping the production staff to find defects in the testing process.

It is worth mentioning that the chip testing device 1 can further include two first data transmission terminals 8. The two first data transmission terminals 8 are connected to the circuit board 10, and the two first data transmission terminals 8 and the connection terminals 4 can be disposed onto the same surface of the circuit board 10. The two first data transmission terminals 8 can be connected to two second data transmission terminals E15 in the accommodating chamber E111 of the environment control apparatus E1, and the chip testing device 1 and the environment control apparatus E1 can transmit data and signals through the first data transmission terminals 8 and the second data transmission terminals E15.

As shown in FIG. 12, in other embodiments of the present disclosure, each of the testing modules 30 can include a processing unit 5 and at least one storage unit 6. When each of the testing modules 30 performs any tests (e.g., the high temperature test, the burn-in test, the low temperature test, or the normal temperature test) on the memory chips C disposed onto the electrical connection sockets 2 connected to each of the testing modules 30, the corresponding test result data C2 and the test parameter data C3 are not limited to be directly stored into the memory chips C, and each of the testing modules 30 can store the test result data C2 and the test parameter data C3 of each of the memory chips C into the at least one storage unit 6 of the chip testing device 1. In a practical application, the storage unit 6 can be disposed in each of the testing modules 30. In other words, after each of the testing modules 30 performs the tests on the memory chips C connected thereto, each of the testing modules 30 can store the test data corresponding to the memory chips C into the storage unit 6 of each of the testing modules 30. In other embodiments of the present disclosure, the storage unit 6 can be independent from the testing modules 30, each of the testing modules 30 is connected to the storage unit 6, and after each of the testing modules 30 finishes the tests on the memory chips C connected thereto, the related test data is transmitted to and stored into the storage unit 6 independent from the testing modules 30.

After the memory chips C carried by the chip testing device 1 finish all of the tests (e.g., the burn-in test, the high temperature test, the low temperature test, or the normal temperature test) according to practical requirements, the central control device can control a read-write apparatus (not shown) to be connected to the connection terminals 4 of the chip testing device 1, so that the test result data C2 and the test parameter data C3 stored in the storage unit 6 of the chip testing device 1 or the storage unit 6 of each of the testing modules 30 can be read and stored into the corresponding memory chips C by the read-write apparatus.

As shown in FIG. 12, in other embodiments of the present disclosure, the chip testing device 1 can further include a wireless transmission unit 7. Through the wireless transmission unit 7, each of the chip testing devices 1 can transmit the test result data C2 and the test parameter data C3 stored by the chip testing devices 1 to the central control device, and the central control device can store each of the test result data C2 and the test parameter data C3 into the corresponding memory chips C through the read-write apparatus.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A memory test method, comprising:
   a burn-in test step implemented by providing a plurality of memory chips in an environment having a first predetermined temperature, and testing each of the memory chips with at least one of a reading test, a writing test, and an electrical property test;
   a burn-in test step result writing step implemented by storing test result data of each of the memory chips after finishing the burn-in test step and test parameter data corresponding to the burn-in test step into each of the memory chips;
   a high temperature test step implemented by providing the memory chips in an environment having a second predetermined temperature, and testing each of the memory chips with at least one of a reading test, a writing test, and an electrical property test; and
   a high temperature test result writing step implemented by storing the test result data of each of the memory chips after finishing the high temperature test step and the test parameter data corresponding to the high temperature test step into each of the memory chips,
   wherein the second predetermined temperature is within a range of 30° C. to 130° C., and the first predetermined temperature is higher than the second predetermined temperature, and wherein the memory test method further includes at least one of a normal temperature test and writing step and a low temperature test and writing step after the high temperature test result writing step, wherein the low temperature test and writing step includes:

a low temperature test step implemented by providing the memory chips in an environment having a third predetermined temperature, and testing each of the memory chips with at least one of a reading test, a writing test, and an electrical property test; and
a low temperature test result writing step implemented by storing the test result data of each of the memory chips after finishing the low temperature test step, and the test parameter data corresponding to the low temperature test step into each of the memory chips, wherein the third predetermined temperature is lower than or equal to 30° C.,
wherein the normal temperature test and writing step includes:
a normal temperature test step implemented by providing the memory chips in an environment having a fourth predetermined temperature, and testing each of the memory chips with at least one of a reading test, a writing test, and an electrical property test; and
a normal temperature test result writing step implemented by storing the test result data of each of the memory chips after finishing the normal temperature test step, and the test parameter data corresponding to the normal temperature test step into each of the memory chips, wherein the fourth predetermined temperature is within a range of 20° C. to 30° C.

2. The memory test method according to claim 1, wherein a first step of the memory test method is a memory chip mounting step implemented by respectively disposing the memory chips onto a plurality of electrical connection sockets of a chip testing device, wherein the chip testing device is configured to be transferred by a transferring apparatus so that the chip testing device is configured to be moved among a plurality of working stations, and wherein the chip testing device includes:
 a circuit board having a first board surface and a second board surface respectively defined by two opposite sides of the circuit board;
 the electrical connection sockets fixed onto the first board surface of the circuit board, wherein the electrical connection sockets are divided into a plurality of socket groups, and each of the socket groups has at least one of the electrical connection sockets;
 a control set disposed on the second board surface of the circuit board and including a plurality of testing modules, wherein the testing modules are connected to the socket groups, and each of the testing modules is connected to at least one of the electrical connection sockets of the corresponding socket group; and
 a power supply member connected to the circuit board;
wherein the chip testing device is connected to an external power supply apparatus through the at least one power supply member so as to receive electricity for an operation of each of the testing modules,
wherein in the burn-in test step, the chip testing device and the memory chips carried thereon are disposed in an environment having a temperature within a range of 30° C. to 200° C., and after the power supply member provides electricity to the chip testing device, any one of the testing modules tests at least one of the memory chips disposed onto at least one of the electrical connection sockets that is connected to the corresponding one of the testing modules with at least one of a reading test, a writing test, and an electrical property test,
wherein in the high temperature test step, the chip testing device and the memory chips carried thereon are disposed in an environment having a temperature within a range of 30° C. to 130° C., and after the power supply member provides electricity to the chip testing device, any one of the testing modules tests at least one of the memory chips disposed onto at least one of the electrical connection sockets that is connected to the corresponding one of the testing modules with at least one of a reading test, a writing test, and an electrical property test, and
wherein in the burn-in test step result writing step and the high temperature test result writing step, each of the testing modules stores the test result data and the test parameter data corresponding to each of the memory chips connected thereto into each of the memory chips.

3. A memory test method, comprising:
a high temperature test step implemented by providing a plurality of memory chips in an environment having a second predetermined temperature, and testing each of the memory chips with at least one of a reading test, a writing test, and an electrical property test;
a high temperature test result writing step implemented by storing the test result data of each of the memory chips after finishing the high temperature test step and the test parameter data corresponding to the high temperature test step into each of the memory chips;
a burn-in test step implemented by providing the memory chips in an environment having a first predetermined temperature, and testing each of the memory chips with at least one of a reading test, a writing test, and an electrical property test; and
a burn-in test step result writing step implemented by storing test result data of each of the memory chips after finishing the burn-in test step and the test parameter data corresponding to the burn-in test step into each of the memory chips,
wherein the second predetermined temperature is within a range of 30° C. to 130° C., and the first predetermined temperature is higher than the second predetermined temperature, and wherein the memory test method further includes at least one of a normal temperature test and writing step and a low temperature test and writing step after the burn-in test step result writing step, wherein the low temperature test and writing step includes:
a low temperature test step implemented by providing the memory chips in an environment having a third predetermined temperature, and testing each of the memory chips with at least one of a reading test, a writing test, and an electrical property test; and
a low temperature test result writing step implemented by storing the test result data of each of the memory chips after finishing the low temperature test step and the test parameter data corresponding to the low temperature test step into each of the memory chips, wherein the third predetermined temperature is lower than or equal to 30° C.,
wherein the normal temperature test and writing step includes:
a normal temperature test step implemented by providing the memory chips in an environment having a fourth predetermined temperature, and testing each of the memory chips with at least one of a reading test, a writing test, and an electrical property test; and
a normal temperature test result writing step implemented by storing the test result data of each of the memory chips after finishing the normal temperature test step and the test parameter data corresponding to the normal temperature test step into each of the memory chips, wherein the fourth predetermined temperature is within a range of 20° C. to 30° C.

4. The memory test method according to claim 3, wherein a first step of the memory test method is a memory chip mounting step implemented by respectively disposing the memory chips onto a plurality of electrical connection sockets of a chip testing device, wherein the chip testing device is configured to be transferred by a transferring apparatus so that the chip testing device is configured to be moved among a plurality of working stations, and wherein the chip testing device includes:

a circuit board having a first board surface and a second board surface respectively defined by two opposite sides of the circuit board;

the electrical connection sockets fixed onto the first board surface of the circuit board, wherein the electrical connection sockets are divided into a plurality of socket groups, and each of the socket groups has at least one of the electrical connection sockets;

a control set disposed on the second board surface of the circuit board and including a plurality of testing modules, wherein the testing modules are connected to the socket groups, and each of the testing modules is connected to at least one of the electrical connection sockets of the corresponding socket group; and a power supply member connected to the circuit board, wherein the chip testing device is connected to an external power supply apparatus through the at least one power supply member so as to receive electricity for an operation of each of the testing modules, wherein in the burn-in test step, the chip testing device and the memory chips carried thereon are disposed in an environment having a temperature within a range of 30° C. to 200° C., and after the power supply member provides electricity to the chip testing device, any one of the testing modules tests at least one of the memory chips disposed onto at least one of the electrical connection sockets that is connected to the corresponding one of the testing modules with at least one of a reading test, a writing test, and an electrical property test, wherein in the high temperature test step, the chip testing device and the memory chips carried thereon are disposed in an environment having a temperature within a range of 30° C. to 130° C., and after the power supply member provides electricity to the chip testing device, any one of the testing modules tests at least one of the memory chips disposed onto at least one of the electrical connection sockets that is connected to the corresponding one of the testing modules with at least one of a reading test, a writing test, and an electrical property test, and wherein in the burn-in test step result writing step and the high temperature test result writing step, each of the testing modules stores the test result data and the test parameter data corresponding to each of the memory chips connected thereto into each of the memory chips.

5. A memory test method, comprising:

a test and record step implemented by providing a plurality of memory chips in a predetermined temperature environment, testing each of the memory chips with at least one of a reading test, a writing test, and an electrical property test, and recording corresponding test result data and test parameter data of each of the memory chips after finishing the at least one of a reading test, a writing test, and an electrical property test in the predetermined temperature environment; and a test result writing step implemented by storing the test result data and the test parameter data corresponding to each of the memory chips into each of the memory chips so that each of the memory chips stores the corresponding test result data and the test parameter data, wherein the test and record step further includes a normal temperature test and record step and a low temperature test and record step, wherein the low temperature test and record step is implemented by providing the memory chips in an environment having a third predetermined temperature, testing each of the memory chips with at least one of a reading test, a writing test, and an electrical property test, and recording the test result data and the test parameter data of each of the memory chips after finishing the at least one of a reading test, a writing test, and an electrical property test, wherein the third predetermined temperature is lower than or equal to 30° C., and wherein the normal temperature test and record step is implemented by providing the memory chips in an environment having a fourth predetermined temperature, testing each of the memory chips with at least one of a reading test, a writing test, and an electrical property test, and recording the test result data and the test parameter data of each of the memory chips after finishing the at least one of a reading test, a writing test, and an electrical property test, wherein the fourth predetermined temperature is within a range of 20° C. to 30° C.

6. The memory test method according to claim 5, wherein the test and record step includes a burn-in test and record step and a high temperature test and record step, wherein the burn-in test and record step is implemented by providing the memory chips in an environment having a first predetermined temperature, testing each of the memory chips with at least one of a reading test, a writing test, and an electrical property test, and recording the test result data and the test parameter data of each of the memory chips after finishing the at least one of a reading test, a writing test, and an electrical property test, and wherein the high temperature test and record step is implemented by providing the memory chips in an environment having a second predetermined temperature, testing each of the memory chips with at least one of a reading test, a writing test, and an electrical property test, and recording the test result data and the test parameter data of each of the memory chips after finishing the at least one of a reading test, a writing test, and an electrical property test, wherein the second predetermined temperature is within a range of 30° C. to 130° C., and the first predetermined temperature is higher than the second predetermined temperature.

7. The memory test method according to claim 6, wherein a first step of the memory test method is a memory chip mounting step implemented by respectively disposing the memory chips onto a plurality of electrical connection sockets of a chip testing device, wherein the chip testing device is configured to be transferred by a transferring apparatus so that the chip testing device is configured to be moved among a plurality of working stations, and wherein the chip testing device includes:

a circuit board having a first board surface and a second board surface respectively defined by two opposite sides of the circuit board;

the electrical connection sockets fixed onto the first board surface of the circuit board, wherein the electrical connection sockets are divided into a plurality of socket groups, and each of the socket groups has at least one of the electrical connection sockets;

a control set disposed on the second board surface of the circuit board and including a plurality of testing modules, wherein the testing modules are connected to the socket groups, and each of the testing modules is connected to at least one of the electrical connection sockets of the corresponding socket group; and a power supply member connected to the circuit board, wherein the chip testing device is connected to an external power supply apparatus through the at least one power supply member so as to receive electricity for an operation of each of the testing modules, wherein in the burn-in test and record step, the chip testing device and the memory chips carried thereon are disposed in an environment having a temperature within a range of 30° C. to 200° C., after the power supply member provides electricity to the chip testing device, any one of the testing modules tests at least one of the memory chips disposed onto at least one of the electrical connection sockets that is connected to the corresponding one of the testing modules with at least one of a reading test, a writing test, and an electrical property test, and each of the testing modules stores the test result data and the test parameter data corresponding to each of the memory chips connected thereto into each of the memory chips, and wherein in the high temperature test and record step, the chip testing device and the memory chips carried thereon are disposed in an environment having a temperature within a range of 30° C. to 130° C., after the power supply member provides electricity to the chip testing device, any one of the testing modules tests at least one of the memory chips disposed onto at least one of the electrical connection sockets that is connected to the corresponding one of the testing modules with at least one of a reading test, a writing test, and an electrical property test, and each of the testing modules stores the test result data and the test parameter data corresponding to each of the memory chips connected thereto into each of the memory chips.

8. The memory test method according to claim 5, wherein a first step of the memory test method is a memory chip mounting step implemented by respectively disposing the memory chips onto a plurality of electrical connection sockets of a chip testing device, wherein the chip testing device is configured to be transferred by a transferring apparatus so that the chip testing device is configured to be moved among a plurality of working stations, and wherein the chip testing device includes:

a circuit board having a first board surface and a second board surface respectively defined by two opposite sides of the circuit board;

the electrical connection sockets fixed onto the first board surface of the circuit board, wherein the electrical connection sockets are divided into a plurality of socket groups, and each of the socket groups has at least one of the electrical connection sockets;

a control set disposed on the second board surface of the circuit board and including a plurality of testing modules, wherein the testing modules are connected to the socket groups, and each of the testing modules is connected to at least one of the electrical connection sockets of the corresponding socket group; and a power supply member connected to the circuit board, wherein the chip testing device is connected to an external power supply apparatus through the at least one power supply member so as to receive electricity for an operation of each of the testing modules, wherein in the burn-in test and record step, the chip testing device and the memory chips carried thereon are disposed in an environment having a temperature within a range of 30° C. to 200° C., after the power supply member provides electricity to the chip testing device, any one of the testing modules tests at least one of the memory chips disposed onto at least one of the electrical connection sockets that is connected to the corresponding one of the testing modules with at least one of a reading test, a writing test, and an electrical property test, and each of the testing modules stores the test result data and the test parameter data corresponding to each of the memory chips connected thereto into each of the memory chips, wherein in the high temperature test and record step, the chip testing device and the memory chips carried thereon are disposed in an environment having a temperature within a range of 30° C. to 130° C., after the power supply member provides electricity to the chip testing device, any one of the testing modules tests at least one of the memory chips disposed onto at least one of the electrical connection sockets that is connected to the corresponding one of the testing modules with at least one of a reading test, a writing test, and an electrical property test, and each of the testing modules stores the test result data and the test parameter data corresponding to each of the memory chips connected thereto into each of the memory chips, and wherein in the normal temperature test and record step and in the low temperature test and record step, each of the testing modules stores the test result data and the test parameter data corresponding to each of the memory chips connected thereto into each of the memory chips.

9. The memory test method according to claim 5, further comprising a determination step between the test and record step and the test result writing step, wherein the determination step is implemented by determining whether each of the memory chips is good or defective according to a test result of each of the memory chips finishing the at least one of a reading test, a writing test, and an electrical property test, wherein in response to each of the memory chips finishing and passing all the tests from the test and record step, the memory chip is determined as a good product, and the test result data and the test parameter data corresponding to the memory chip are stored into the memory chip, and wherein in response to each of the memory chips not passing at least one of the tests from the test and record step, the memory chip is determined as a defective product, and the test result data and the test parameter data corresponding to the memory chip are not stored into the memory chip.

\* \* \* \* \*